United States Patent
Hartzell et al.

(10) Patent No.: US 7,217,588 B2
(45) Date of Patent: May 15, 2007

(54) INTEGRATED MEMS PACKAGING

(75) Inventors: John W. Hartzell, Camas, WA (US); Harry Garth Walton, Beckley (GB); Michael James Brownlow, Drayton (GB)

(73) Assignee: Sharp Laboratories of America, Inc., Camas, WA (US)

( * ) Notice: Subject to any disclaimer, the term of this patent is extended or adjusted under 35 U.S.C. 154(b) by 48 days.

(21) Appl. No.: 11/178,148

(22) Filed: Jul. 8, 2005

(65) Prior Publication Data

US 2006/0148137 A1    Jul. 6, 2006

Related U.S. Application Data

(63) Continuation-in-part of application No. 11/031,320, filed on Jan. 5, 2005.

(51) Int. Cl.
*H01L 21/00* (2006.01)
(52) U.S. Cl. .................. 438/51; 438/48; 438/E21.499
(58) Field of Classification Search ............ 438/48–51, 438/113–119; 257/730, 777, 569, 678
See application file for complete search history.

(56) References Cited

U.S. PATENT DOCUMENTS

| | | | | |
|---|---|---|---|---|
| 6,400,009 | B1 * | 6/2002 | Bishop et al. | 257/704 |
| 6,624,033 | B2 * | 9/2003 | Noble | 438/300 |
| 6,803,127 | B2 | 10/2004 | Su et al. | 428/690 |

* cited by examiner

*Primary Examiner*—Dung A. Le
(74) *Attorney, Agent, or Firm*—Law Office of Gerald Maliszewski; Gerald Maliszewski

(57) ABSTRACT

An integrated MEMS package and associated packaging method are provided. The method includes: forming an electrical circuit, electrically connected to the first substrate; integrating a MEMS device on a first substrate region, electrically connected to the first substrate; providing a second substrate overlying the first substrate; and, forming a wall along the first region boundaries, between the first and second substrate. In one aspect, the electrical circuit is formed using thin-film processes; and, wherein integrating the MEMS device on the first substrate region includes forming the MEMS using thin-film processes, simultaneous with the formation of the electrical device. Alternately, the MEMS device is formed in a separate process, attached to the first substrate, and electrical interconnections are formed to the first substrate using thin-film processes.

19 Claims, 8 Drawing Sheets

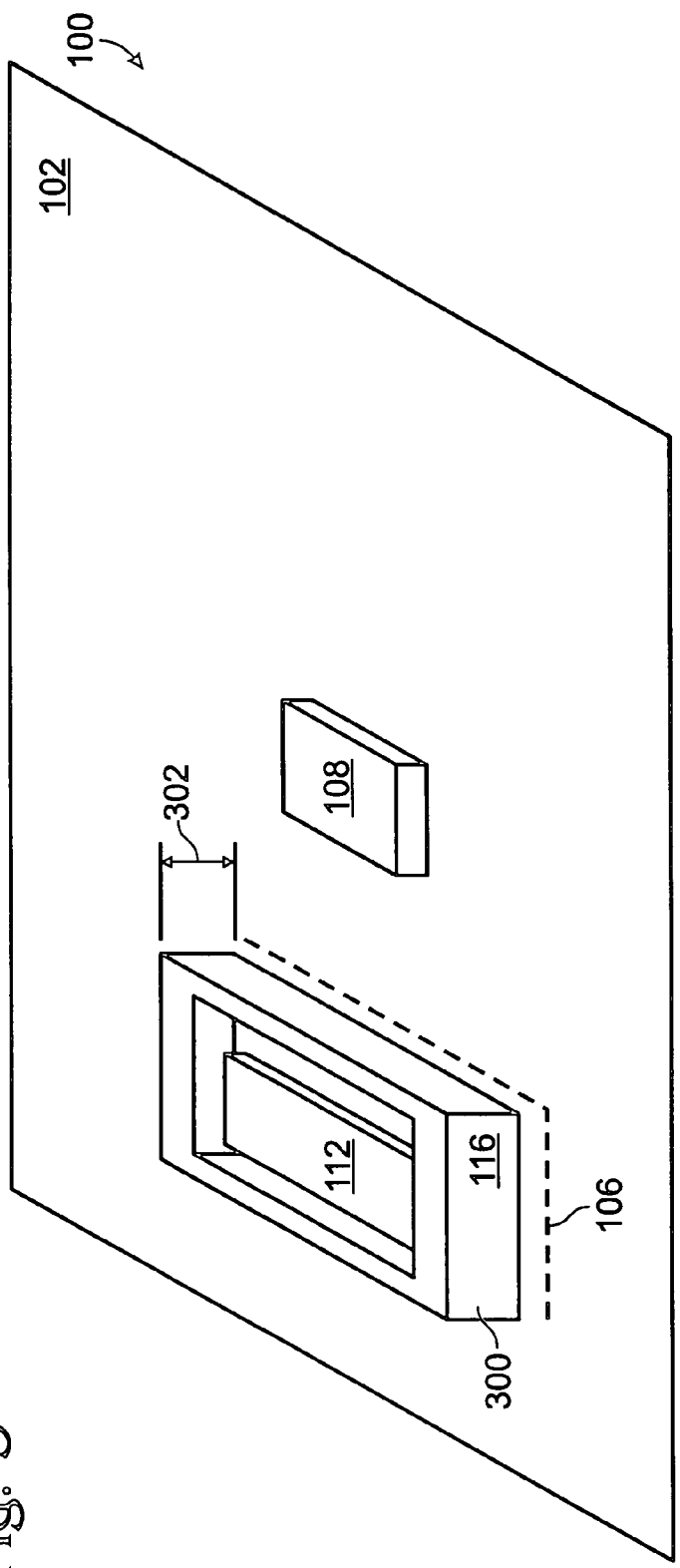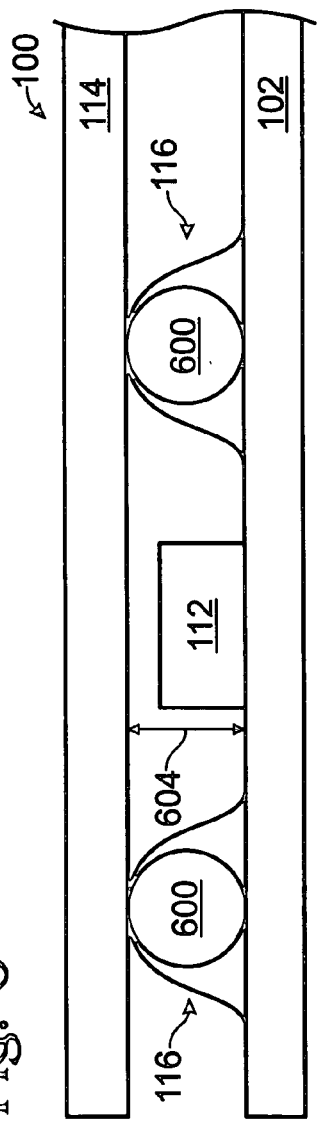

INTEGRATED MEMS PACKAGING

RELATED APPLICATIONS

This application is a continuation-in-part of a pending patent application entitled, PIEZO-TFT CANTILEVER MEMS, invented by Zhan et al., Ser. No. 11/031,320, filed Jan. 5, 2005. This application is incorporated herein by reference.

BACKGROUND OF THE INVENTION

1. Field of the Invention

This invention generally relates to the packaging of microelectromechanical systems (MEMS) and, more particularly, to a system and method for simultaneously packaging a MEMS device with active circuitry on an integrated circuit (IC) substrate.

2. Description of the Related Art

MEMS devices are typically made on silicon wafers; using one of two well established techniques: bulk micro-machining or surface micro-machining. In both of these methods, the MEMS device is fabricated on a silicon wafer using standard IC-type fabrication equipment. Once the wafer is processed, the wafer is diced to form individual die. These MEMS die may or may not be integrated with electronic components (on CMOS). Once the die is cingu-lated, it must then be packaged in some form of package, similar to an IC package. This package is eventually inserted into a socket or bonded to a Printed Circuit Board (PCB) as part of an overall system, i.e., a cell phone. These packages can be quite elaborate, depending on the MEMS style and application, including vacuum package requirements. In addition, because many MEMS devices are required to move during operation, the package must provide a cavity that allows for this movement.

One problem with this type of MEMS packaging methodology is that the package is a very large proportion of the total MEMS device cost; on the order of 30–70% of the overall cost. This packaging cost can, therefore, have a significant impact on the capability of such MEMS devices to penetrate cost-sensitive markets, such as the cell phone market.

Another problem with existing MEMS packaging is the noise inherent with the electrical connections between the MEMS package and the rest of the system. The bonding, wiring, and electrical interconnections associated with interfacing a MEMS device embedded in a package, to a circuit, necessarily adds impedance mismatches that result in noisy or low amplitude signals.

However, there is mounting evidence that MEMS technology can add value to systems, such as cell phones, in a market that is ripe for new technology, if only the packaging issue could be addressed. Continuing with the cell phone example, it is certain that the camera-on-cell phone has made a great impact on the market. The search is on for the next added functionality that can drive new expansion of the cell phone market.

MEMS are being considered for the following cell phone functions:

1) Motion capture (Accelerometer and gyroscope);
2) Microphones;
3) RF devices and RF modules;
4) Image capture;
5) Low power solutions;
6) Identification (biometrics);
7) Enhanced display functionality; and,
8) Personal health and safety monitoring.

The issues preventing MEMS penetration into the cell phone market are cost and performance. As mentioned above, packaging is 30–70% of the MEMS device cost. This cost issue is preventing the integration of MEMS into cell phones, display systems, and many other types of electronic devices.

MEMS devices are a logical derivative of semiconductor IC processes that may be used to develop micrometer scale structural devices such as transducers or actuators, and they are typically fabricated on silicon substrates. MEMS devices typically interface physical variables and electronic signal circuits. The integration of MEMS into larger scale systems has been expensive to fabricate due to the process difficulties and the cost associated with integrating the MEMS standard IC technologies, such as CMOS. The processes used to fabricate MEMS on glass offer the advantage that the integration of electrical and mechanical functions is easily done. In this way, system level integration is possible and cost effective.

It would be advantageous if MEMS devices could be packaged as part of the overall process of fabricating active devices on a circuit board or display.

SUMMARY OF THE INVENTION

The problem solved by this invention is the creation of a low-cost packaging system for the integration of electrical, mechanical and optical MEMS devices with electrical systems. By way of example, the packaging of MEMS device on a display screen is presented (i.e., a cell phone display), but the invention is not limited to any particular electrical system. Generally, it is assumed that the MEMS device to be packaged can be any type of mechanical, electrical, optical, or micro-fluidic device that requires encapsulation or packaging.

One aspect of this invention deals with the integration of MEMS on glass substrates using low temperature polysilicon technology. Using this invention, the MEMS device and amplification circuitry can be integrated together, monolithically fabricated on the glass substrate and encapsulated. The advantage of monolithic fabrication is the seamless blending of electrical and mechanical devices in the polysilicon integrated approach resulting in overall system electrical quality better than, or similar to the approach where discreet MEMS packages are integrated with standard integrated circuits.

Accordingly, a method is provided for packaging a MEMS device. The method comprises: forming an electrical circuit electrically connected to a first substrate; integrating a MEMS device on a first substrate region, electrically connected to the first substrate; providing a second substrate overlying the first substrate; and, forming a wall along the first region boundaries, between the first and second substrates.

In one aspect, the electrical circuit is formed using thin-film processes; and, integrating the MEMS device on the first substrate region includes forming the MEMS using thin-film processes, simultaneous with the formation of the electrical device. Alternately, the MEMS device is formed in a separate process, attached to the first substrate, and electrical interconnections are formed to the first substrate using thin-film processes.

The wall formed along the first region boundaries may act to enclose the MEMS device between the first and second substrates. For example, the MEMS device may be hermetically sealed. Alternately, the second substrate may have an opening through it, and the MEMS device may be an environmental sensor. The wall between the first and second substrate then acts to isolate the MEMS device from the electrical circuit, while exposing the MEMS device to an environment via the second substrate opening. For example, the MEMS environmental sensor may be a micro-fluidic MEMS that is exposed to a fluid environment.

The wall between the first and second substrate may be a sealant bonding the first substrate to the second substrate. Spacers may be used to maintain a uniform distance between the first and second substrates. In another aspect, the wall is an O-ring held in place by grooves in the first and second substrates.

Additional details of the above-described method and an integrated MEMS device package are provided below.

BRIEF DESCRIPTION OF THE DRAWINGS

FIG. 3 is a perspective drawing showing a wall formed as part of a prefabricated separating assembly.

FIG. 6 is a partial cross-sectional view of a variation in the integrated package of FIG. 1B.

DETAILED DESCRIPTION

Figure 1A:
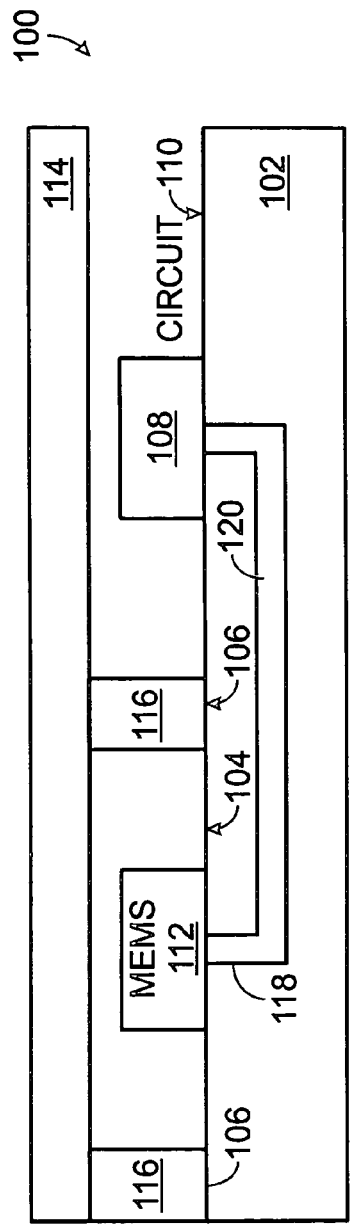
FIGS. 1A and 1B is a partial cross-sectional and plan views, respectively, of an integrated microelectromechanical system (MEMS) device package.
Figure 1B:
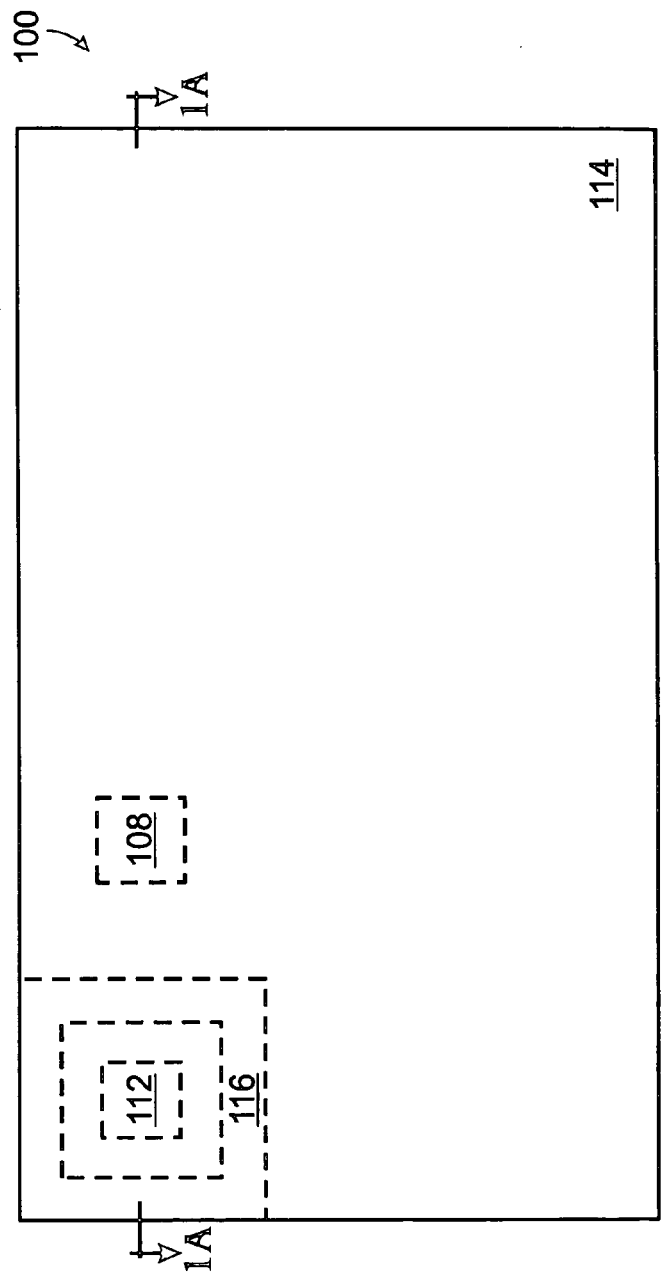

FIGS. 1A and 1B is a partial cross-sectional and plan views, respectively, of an integrated microelectromechanical system (MEMS) device package. The MEMS integrated package 100 comprises a first substrate 102 having a first region 104 with boundaries 106. An electrical circuit 108 is formed on a second region 110 of the first substrate 102. The electrical circuit 108 is electrically connected to the first substrate 102. For example, traces in the first substrate may conduct dc power, ground, and electrical signals to the electrical circuit 108. A MEMS device 112 is shown on the first region 104, electrically connected to the first substrate 102. The boundaries 105 may, or may not completely form a perimeter that surrounds the MEMS device 112. A second substrate 114 overlies the first substrate 102. A wall 116 is formed along the first region boundaries 106, between the first substrate 102 and second substrate 114.

In its simplest form, the first substrate 102 is a one-sided board with electrical traces on one of the surfaces. In this case, the electrical circuit 108 and the MEMS 112 may be dice that are attached using ball grid array (BGA) connections, or electrically connected using thin-film processes such as metal deposition and selective etching. Typically however, the first substrate is made from multiple electrical layers separated by interlevel dielectrics, as is common in CMOS and thin-film processes. Low-temperature thin-film processes are often used if the first substrate is glass, plastic, or quartz, as would be the case if a liquid crystal display (LCD) is being fabricated. As shown, the MEMS 112 is connected through via 118 and interlevel trace 120 to the electrical circuit 108.

In some aspects, the electrical interconnection between the MEMS 112 and the electrical circuit 108 may carry an electrical signal. For example, the MEMS 112 may trigger the gate of a TFT electrical circuit. In other aspects, the MEMS 112 and the electrical circuit 108 merely share common dc voltages and grounds (the MEMS does not electrically communicate with the electrical circuit). In another aspect, the MEMS 112 may be electrically connected to other circuit boards via a connector to the first substrate 102 (not shown). For example, the MEMS device 112 may a microphone mounted on the LCD screen of a cell phone, in communication with the cell phone transmission circuitry.

Figure 2:
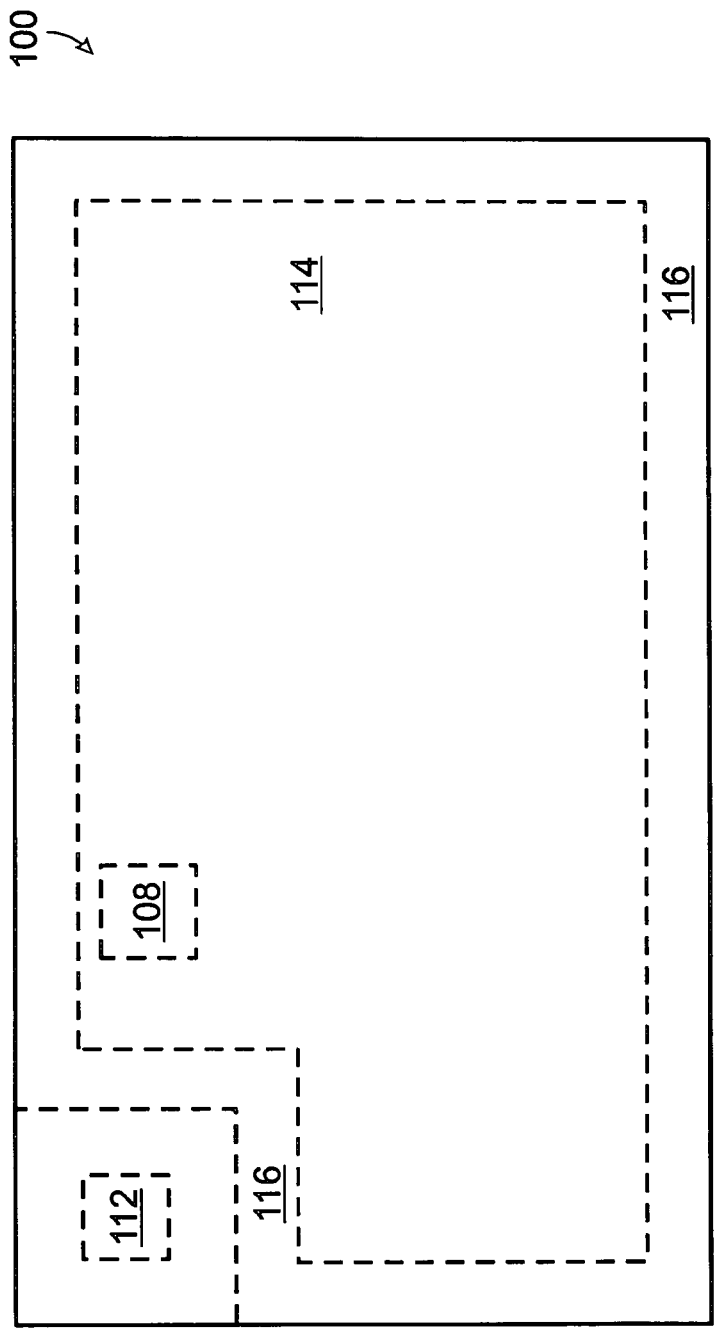
FIG. 2 is a plan view showing an alternate configuration of the wall separating the MEMS from the electrical circuit.

FIG. 2 is a plan view showing an alternate configuration of the wall separating the MEMS from the electrical circuit. The wall 116 may completely enclose the MEMS 112, with the first substrate 102, the second substrate 114, along the first region boundaries 106, as shown in FIG. 1B. That is, the combination of substrates and wall form a cavity in which the MEMS 112 is seated. In one aspect, the wall hermetically seals the MEMS device 112 between the first substrate 102 and second substrate 114 along the first region boundaries 106. Alternately as shown in FIG. 2, the MEMS 112 is separated from the electrical circuit because the electrical circuit 108 is completely enclosed by wall 116. Such an integrated package acts to generally protect the MEMS 112 while exposing it to the ambient environment. The wall 116 may hermetically seal the electrical circuit 108.

Figure 4:
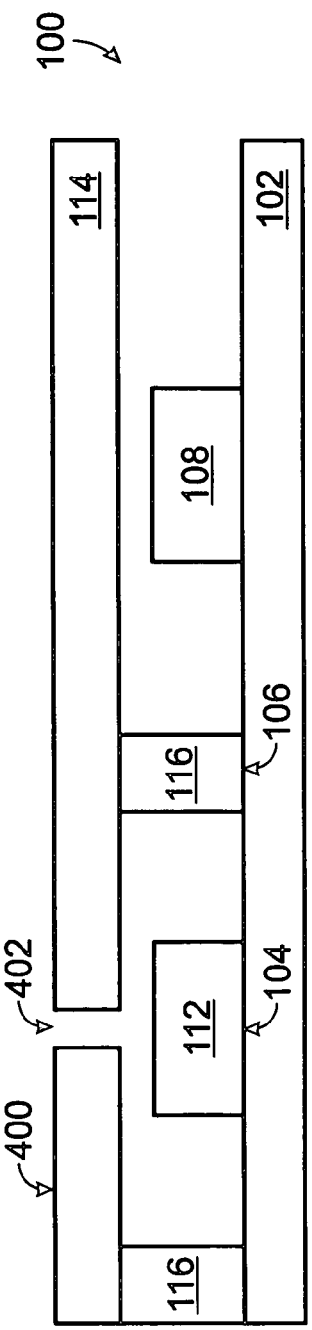
FIG. 4 is a cross-sectional view depicting a first alternate aspect of the integrated package of FIG. 1B.

FIG. 4 is a cross-sectional view depicting a first alternate aspect of the integrated package of FIG. 1B. The second substrate 114 has a third region 400 with an opening 402, overlying the first substrate first region 104. The opening 402 exposes the MEMS device 112 to an environment. For example, the MEMS 112 may be an environmental sensor. The wall 116 isolates the MEMS device 112 from the electrical circuit 108 along the first region boundaries 106. It may be undesirable that the electrical circuit is exposed to the environment seen by the MEMS. For example, the MEMS 112 may be microphone exposed to the ambient environment via opening 402.

Figure 5:
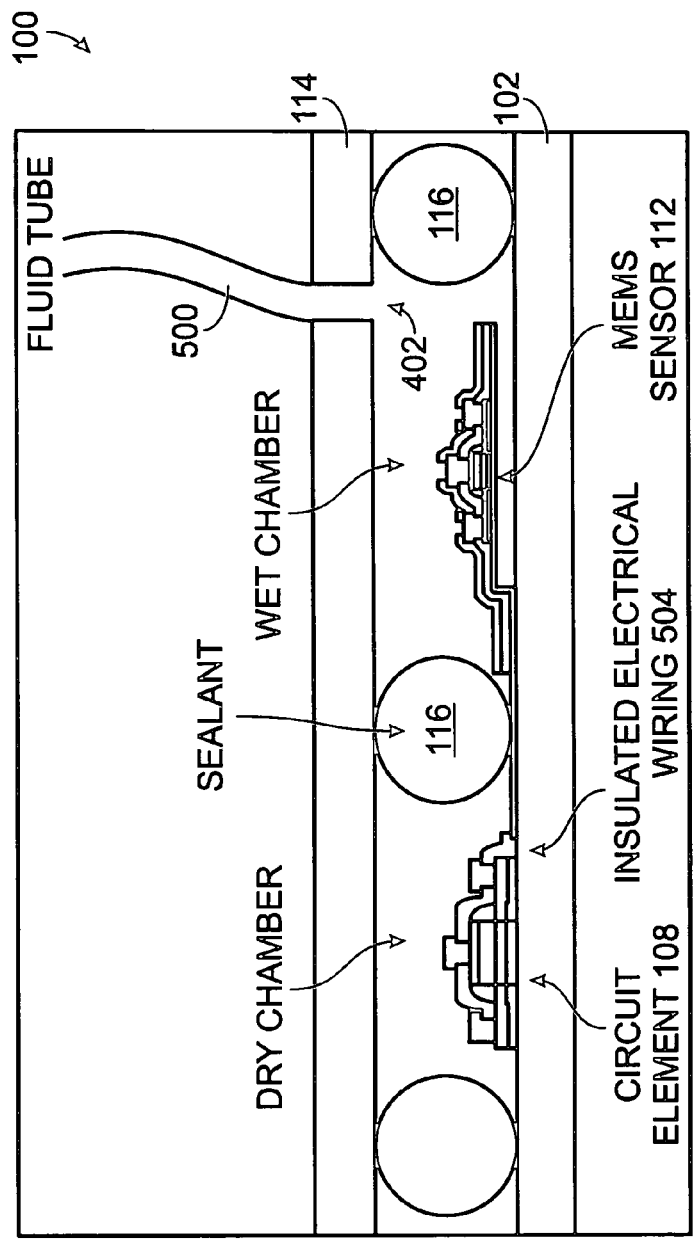
FIG. 5 is a cross-sectional view depicting a second alternate aspect of the integrated package of FIG. 1B.

FIG. 5 is a cross-sectional view depicting a second alternate aspect of the integrated package of FIG. 1B. Here, the MEMS 112 is a micro-fluidic MEMS, depicted as a piezo-TFT cantilever. The second substrate opening 402 exposes the micro-fluidic MEMS to a fluid environment. The integrated package 100 may be immersed in a fluid, or as shown, the fluid is introduced to the opening 402 through a tube 500.

As shown, the electrical circuit 108 on the second region 110 of the first substrate 102 is an active circuit including a TFT, electrically connected to the MEMS 112 via a trace 504. The wall 116 along the first region boundaries 106 separates the TFT 108, exposed to a first environment, from the MEMS 112, exposed to a second environment. For example, the first environment can be ambient atmosphere and the second environment can be a fluid. As shown, in some aspects the wall 116 is a cured sealant.

FIG. 6 is a partial cross-sectional view of a variation in the integrated package of FIG. 1B. In some aspects, the wall 116 includes uniformly-sized spacers 600 embedded in a cured sealant 602, to maintain a uniform distance 604 between the first substrate 102 and the second substrate 114. Alternately, as shown in FIG. 10B, a plurality of uniform-shaped spacers applied to the first (or second) substrate 102. The wall is a cured sealant 602, with a uniform height 604 between the first and second substrates, response to the spacers 600.

Figure 7A:
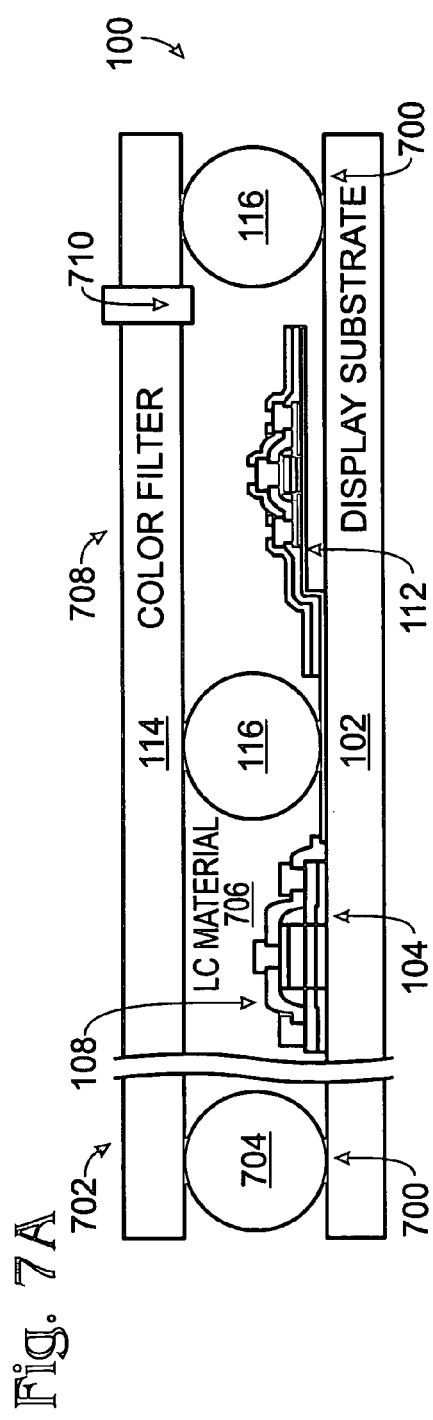
FIGS. 7A and 7B are partial cross-sectional and plan views, respectively, of a liquid crystal display (LCD) integrated package.
Figure 7B:
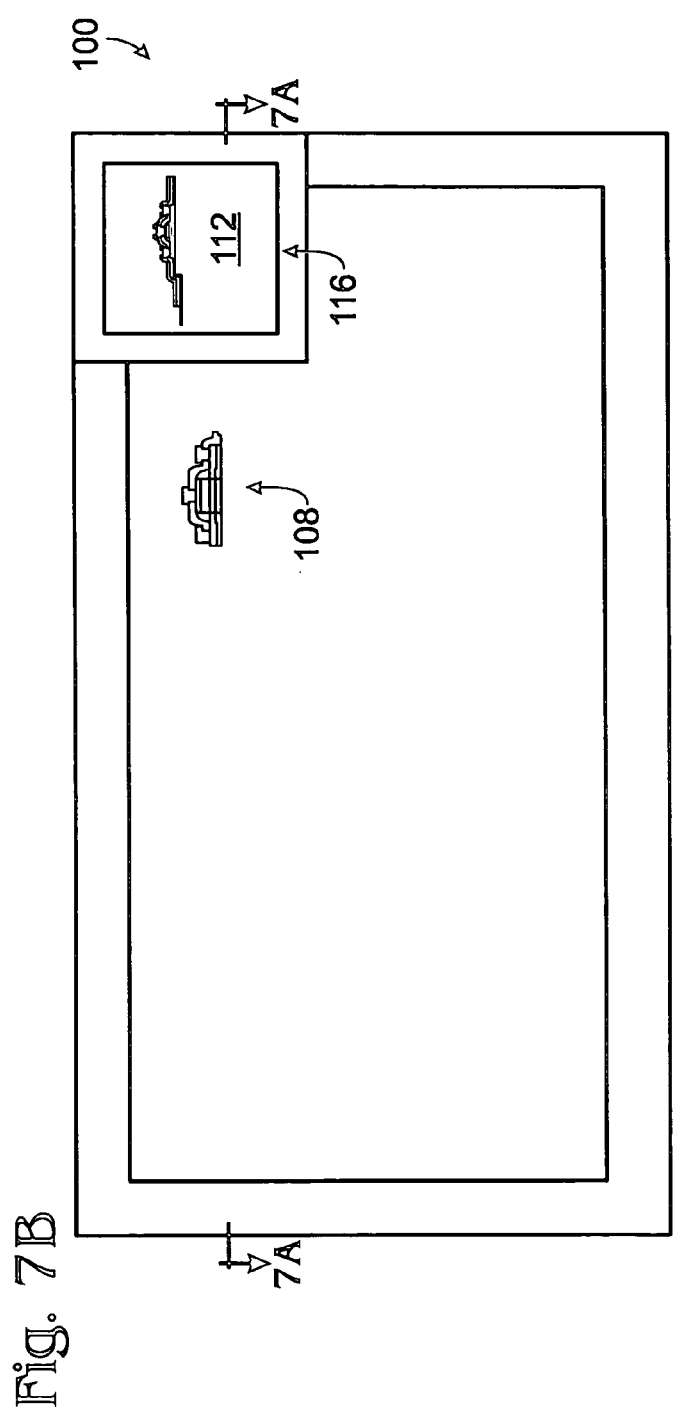

FIGS. 7A and 7B are partial cross-sectional and plan views, respectively, of a liquid crystal display (LCD) integrated package. FIG. 7A is not exactly drawn to the scale of FIG. 7B. The first substrate 102 is an LCD display substrate (i.e., glass) with a perimeter 700. As in FIG. 1B, the MEMS 112 is enclosed by wall 116. The second substrate 114 is a color filter substrate with a perimeter 702. Perimeter 700 cannot be seen in FIG. 7B, but is approximately underlies perimeter 702 (substrate 102 cannot be seen in the plan view). A seal 704 is formed along the perimeters 700/702 of the display substrate 102 and color filter substrate 114. A cavity 706 is formed between the display substrate 102 and the color filter substrate 114, bounded by the seal 704. In one aspect, the cavity 706 is filled with liquid crystal material. In this case, the wall prevents the liquid crystal material from coming in contact with the MEMS 112.

In one aspect as shown, the color filter substrate 114 has a third region 708 with an opening 710 through the substrate, overlying the first substrate first region 104. For example, the MEMS device 112 can be a MEMS microphone. However, other types of MEMS devices can be package integrated into an LCD.

Figure 9:
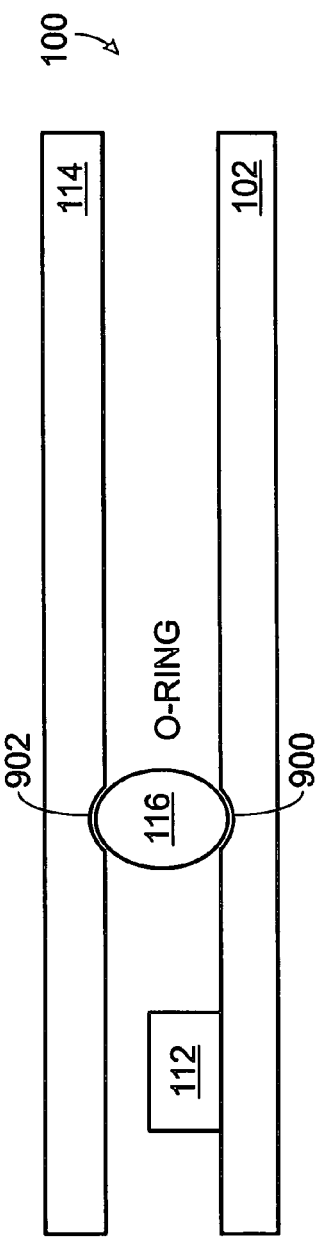
FIG. 9 is a partial cross-sectional view showing an alternative wall design.
Figure 8A:
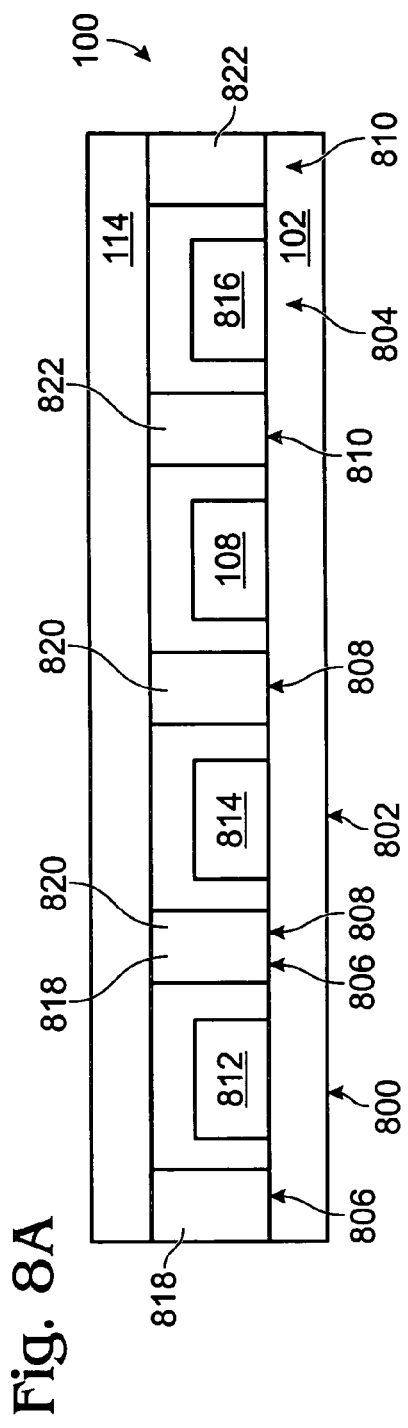
FIGS. 8A and 8B are partial cross-sectional and plan views, respectively, of an alternate aspect of the integrated package of FIGS. 1A and 1B.
Figure 8B:
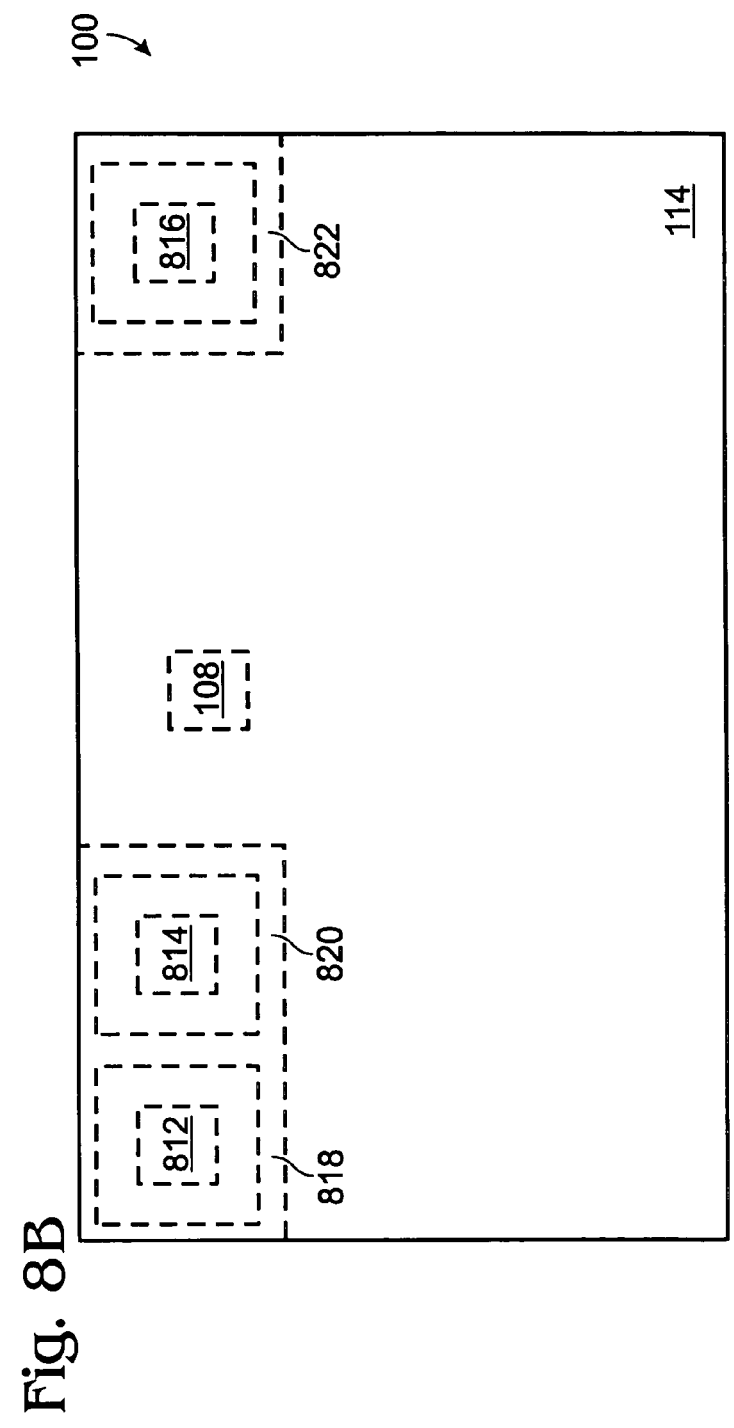

FIGS. 8A and 8B are partial cross-sectional and plan views, respectively, of an alternate aspect of the integrated package of FIGS. 1A and 1B. The first substrate 102 includes a plurality of regions with boundaries. Shown are regions 800, 802, and 804, with respective boundaries 806, 808, and 810. The MEMS integrated package 100 further comprises a plurality of MEMS devices 812, 814, and 816 on the first substrate 102, each in a corresponding region. A plurality of walls 818, 820, and 822 are formed around the boundaries of a corresponding region of the first substrate. FIG. 9 is a partial cross-sectional view showing an alternative wall design. The first substrate 102 includes a groove 900 formed along the first region boundaries 106. Likewise, the second substrate 114 includes a groove 902 formed in a region opposite the groove 900 in the first substrate 102. In this case the wall 116 is an O-ring seated in the first and second substrate grooves 900/902. This arrangement permits a seal to be formed by merely clamping the substrates 102/114 together. Although only sealant and O-ring walls have been specifically depicted, the integrated package is not limited to any particular wall design. In some aspects not shown, the wall is formed by the deposition and selective etching of field oxide. Alternately, the wall can be formed in conventional LC display substrate fabrication processes.

FIG. 3 is a perspective drawing showing a wall formed as part of a prefabricated separating assembly. A boundary assembly 300 is shown having the shape matching the first regions boundaries 106, and having a height 302. Note, the assembly can be made from separate pieces that may, or may not interlock. The assembly pieces can be a conventional rigid, semi-rigid, or even flexible plastic material. In this aspect, the wall 116 comprises the boundary assembly 300 attached to the first substrate 102 along the first region boundaries 106, separating the first substrate 102 from the second substrate (not shown for clarity) by the boundary assembly height 302. The boundary assembly can be fixed in place by an adhesive or held in place by substrate friction.

Although only microphone and fluidic MEMS devices have been specifically depicted, the present invention integrated package is not particularly limited to any type of MEMS or MEMS function. For example, other MEMS that can be packaged include an acoustic speaker, a radio frequency (RF) filter, an RF antenna, an accelerometer, a gyroscope, a chemical sensor, a temperature sensor, a humidity sensor, a pressure sensor, a light sensor, an infrared sensor, or an actuator.

Functional Description

Conventionally, MEMS on display are packaged as discreet components in IC-like packages and then attached to the system using standard IC packaging assembly techniques. This invention teaches a new way to establish the MEMS package on the display itself, by utilizing the existing display assembly process to create the package, resulting in a no-cost package for the MEMS device. Given the high cost of typical MEMS packages, this invention has a clear advantage for display integration and system level cost reduction.

Figure 10A:
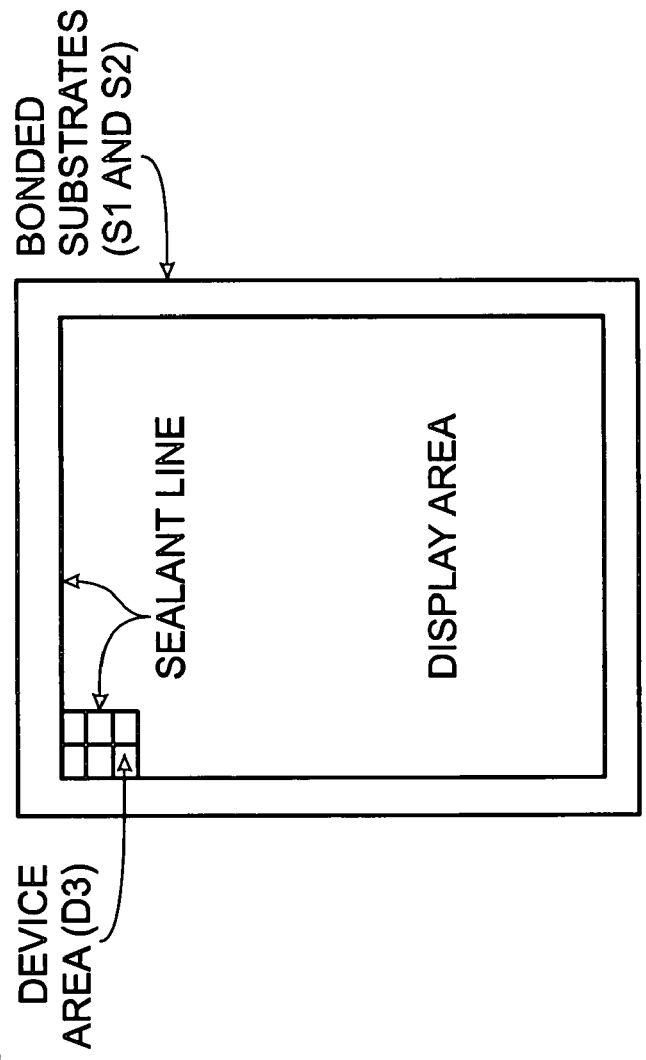
FIGS. 10A and 10B are plan and partial cross-sectional views, respectively, depicting the encapsulation of a MEMS device on a display substrate.
Figure 10B:
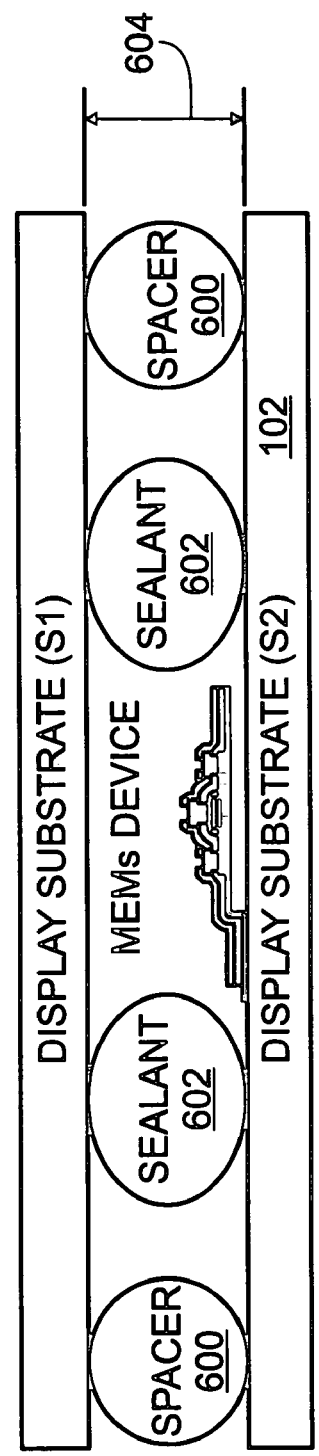

FIGS. 10A and 10B are plan and partial cross-sectional views, respectively, depicting the encapsulation of a MEMS device on a display substrate. Note, the MEMS device area (D3) is not to scale in FIG. 10B. The actual device area is much smaller, so as to not interfere with the display operation. The invention creates a MEMS (or other device) encapsulation/package on a display substrate by using the standard cell processing in the LCD manufacturing process. The MEMS can be either monolithically fabricated on the display substrate during the array process, or transferred after the array process is complete. The MEMS devices are encapsulated during the display cell process, with display substrates on the top and bottom and sealant (bounding the glass substrates together on the sides). Referencing FIGS. 10A and 10B, an exemplary fabrication process follows.

1) A MEMS device (or other mechanical, electrical or optical device) is attached to a display substrate (S1), either through monolithic fabrication of the MEMS device during array fabrication or transfer of the device to S1 after array fabrication.

2) A counter substrate (S2) (color filter substrate in the case of many LCD display processes) is prepared for mating to the first substrate (S1), to form a display device. Prior to bonding S1 and S2, spacers are applied to one of the substrates to maintain even separation between S1 and S2 after bonding. This is a standard LCD cell process.

3) A sealant is applied to either S1 or S2, forming the outline of at least one display area and at least one separate area for devices (D3), such as MEMS.

4) S1 and S2 are bonded together forming a display device and an encapsulated package for the devices area (D3), bounded on the sides by the sealant and the top and bottom by S1 and S2.

5) The display area likely undergoes further processing, such as injection of liquid crystal material (in the case of LCD display). However, D3 can be protected from these additional processes by the encapsulation.

6) D3 can possibly be a vacuum package, depending on the processing steps and environment of the processes that bond S1 and S2.

7) If it is desirable to expose device area D3 to the environment, then one or both S1 and S2 may be pre-drilled in the area of D3 to provide this condition. This is desirable in the case where D3 houses an environmental sensor, for example.

8) Because the device area (D3) and the display area are separately encapsulated, there is no cross contamination.

Another aspect of the invention uses the encapsulation method for the integration of devices (such as MEMS) through some sort of transfer process. For example, in the case of amorphous silicon displays, the MEMS device might be fabricated on another substrate and later transferred to the display substrate. Subsequent to this transfer there are additional process steps to integrate the electrical and mechanical devices, followed by the final encapsulation process. Although LCD displays have been used as an example, in other aspects the present invention packaging technique can also be used OLED, electrophoretic, FED, and other types of displays.

In a different aspect, multiple device areas can be created using the above-mentioned techniques to accomplish one of the following:

1) Packaging areas can be separated by functionality. For example, one packaged device area can be a vacuum package, containing MEMS devices requiring a vacuum environment, and another is exposed to the environment (containing environment sensors), through holes drilled in one of the glass substrates.

2) Packaging areas can be separated by a defined distance, but linked by operation. For example, a first device area might contain a MEMS microphone. A second, separate, device area might contain a second MEMS microphone. Because the exact spatial relationship between the devices is controlled within the stringent limits of a photolithography process, the two devices can be coupled into a system solution. In the case of microphone example, the acoustic input can be coupled and the known microphone spatial relationship used to sense from where a particular sound is coming. The sound source data can be used to accomplish some desired result.

MEMS on Glass

The use of glass substrates offers unique opportunities to produce surface novel micro machined devices and integrate them into system level applications. Table 1 highlights some of the advantages of MEMS on glass over MEMS on silicon substrates.

TABLE 1

Comparison of Silicon vs. Glass substrates

| Attribute | Silicon substrate | Glass substrate |
|---|---|---|
| Cost | moderate | low |
| Max substrate size (m$^2$) | 1 | >2.7 |
| Optical properties | Transparent to IR | Transparent to all wavelengths |
| Electrical insulation | poor | excellent |
| Dielectric properties | poor | excellent |
| Biological compatibility | poor | excellent |
| Thermal insulation | poor | excellent |
| Max temperature | 1400 C. | 650 C. |
| Crystallographic bulk etch | yes | no |

MEMS on glass offer the following unique points:

1) The optical transparency of glass (other than its obvious advantage for displays) permits the creation of novel MEMS devices. For example, it is possible to optically sense the motion of a device through the substrate without requiring through-holes or expensive packaging.

2) MEMS devices can be built on the same substrate as LC displays. This provides opportunities to build other novel devices, such as integrated MEMS sensors on display.

3) Integrated RF on display One of the stumbling blocks when developing RF and electromagnetic MEMS devices is the effect of the silicon substrate. Typically, large quantities of substrate must be removed to improve the quality of the MEMS device. By using a glass substrate, this process is not necessary and the devices are simpler to manufacture and are more physically robust (since the substrate is intact).

4) Additionally, many MEMS processes need to take special steps to electrically isolate individual moving elements from each other when they're all attached to the same conductive and parasitic substrate. Again, with glass, this isolation is inherently not necessary.

5) Micro-fluidic and biological applications often require materials that are bio-compatible, i.e. are biologically inert. Glass is one such material. It is simpler to start with a bio-compatible material (such as a glass substrate) than to use incompatible materials and coat them with appropriate surfaces.

6) Quite a few MEMS applications require thermal insulation between elements, such as bio-meters (IR sensors), field emission tips, and chemical detectors. With devices on a silicon substrate, much of the substrate must be removed to provide this thermal insulation. By using a glass substrate, each element is inherently isolated.

Figure 11:
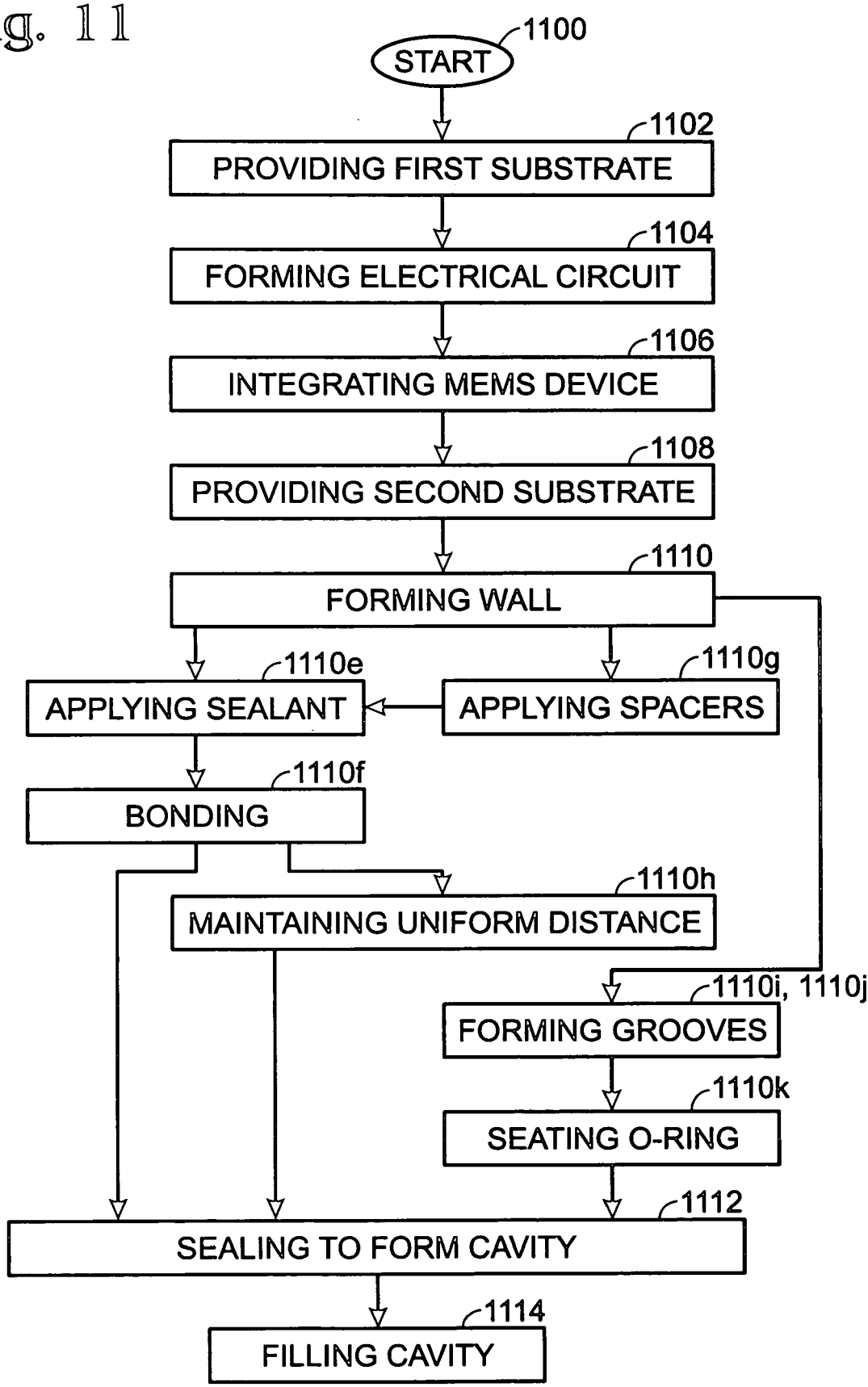
FIG. 11 is a flowchart illustrating a method for packaging a MEMS device.

FIG. 11 is a flowchart illustrating a method for packaging a MEMS device. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Various steps in the method may be better understood in the context of the explanations of FIGS. 1A through 10B, above. The method starts at Step 1100.

Step 1102 provides a first substrate having a first region with boundaries. Step 1104 forms an electrical circuit on a second region of the first substrate, electrically connected to the first substrate. Step 1106 integrates a MEMS device on the first region, electrically connected to the first substrate. Some examples of MEMS devices include an acoustic speaker, a microphone, a radio frequency (RF) filter, an RF antenna, an accelerometer, a gyroscope, a chemical sensor, a temperature sensor, a humidity sensor, a pressure sensor, a light sensor, an infrared sensor, and an actuator. Step 1108 provides a second substrate overlying the first substrate. Step 1110 forms a wall along the first region boundaries, between the first and second substrate.

In one aspect, forming the electrical circuit in Step 1104 includes forming an electrical device using thin-film processes. Step 1106 integrates the MEMS device on the first region using thin-film processes, simultaneous with the formation of the electrical device. Alternately, integrating the MEMS device on the first region in Step 1106 includes substeps (not shown). Step 1106a forms the MEMS device (i.e., in a process independent of the electrical circuit (Step 1104). Step 1106b attaches the MEMS device to the first substrate first region. Step 1106c forms electrical interconnections between the MEMS device and the first substrate using thin-film processes.

In one aspect, forming a wall along the first region boundaries in Step 1110 includes enclosing the MEMS device between the first substrate, the second substrate, and the wall. For example, the MEMS device can be hermetically enclosed.

In a different aspect, Step 1108 provides a second substrate having an opening overlying the first substrate first region. In this aspect, Step 1106 integrates a MEMS environmental sensor. Step 1110 forms a wall along the first region boundaries using the following substeps (not shown). Step 1110*a* isolates the MEMS device from the electrical circuit, and Step 1110*b* exposes the MEMS device to a first environment via the second substrate opening. For example, Step 1106 may integrate a micro-fluidic MEMS, and Step 1110*b* exposes the micro-fluidic MEMS to a fluid environment.

In another example, Step 1104 forms an active circuit including a TFT, electrically connected to the MEMS. Then, forming a wall between the first and second substrate along the first region boundaries in Step 1110 includes alternate substeps (not shown). Step 1110*c* exposes the MEMS to a first environment. Step 1110*d* exposes the TFT to a second environment.

In another aspect, Step 1110 forms a wall along the first region boundaries using the following substeps. Step 1110*e* applies a sealant along the first region boundaries, and Step 1110*f* bonds the first substrate to the second substrate. In one variation, Step 1110*g* applies uniformly shaped spacers to the first substrate and Step 1110*h* maintains a uniform distance between the first and second substrates in response to the spacers. Alternately, forming a wall in Step 1110 includes other substeps. Step 1110*i* forms a groove in the first substrate along the first region boundaries, and Step 1110*j* forms a groove in the second substrate, opposite the groove in the first substrate. Then, Step 1110*k* seats an O-ring in the first and second substrate grooves. Note, the grooves may also be preformed in the substrates that are provided in Step 1102 and 1108.

In one specific example, Step 1102 provides a liquid crystal display (LCD) display substrate with a perimeter, and Step 1108 provides a color filter substrate with a perimeter. Then, Step 1112 seals the display substrate to the color filter substrate along the perimeters to form a cavity. Step 1114 fills the cavity with a liquid crystal material. In one variation of this example, Step 1108 provides a color filter substrate having an opening through the substrate, overlying the first substrate first region, and Step integrates a MEMS microphone.

In another aspect, Step 1102 provides a first substrate with a plurality of regions with boundaries, and Step 1106 integrates a plurality of MEMS devices on the first substrate, each in a corresponding region. Then, Step 1110 forms a wall around the boundaries of each region of the first substrate.

In another aspect, forming a wall along the first region boundaries in Step 1110 includes: providing a boundary assembly having a shape matching the first region boundaries and a height; and, attaching the boundary assembly to the first substrate, overlying the first region boundaries, separating the first substrate from the second substrate by the boundary assembly height.

An integrated MEMS package and MEMS packaging method have been provided. Examples of particular MEMS devices and electrical circuits have been given to help illustrate the invention. However, the invention is not limited to merely these examples. Other variations and embodiments of the invention will occur to those skilled in the art.

We claim:

1. An integrated microelectromechanical system (MEMS) device package, the MEMS integrated package comprising:
    a first substrate having a first region with boundaries;
    an electrical circuit on a second region of the first substrate, electrically connected to the first substrate;
    a MEMS device environmental sensor on the first region, electrically connected to the first substrate;
    a second substrate overlying the first substrate, having an opening overlying the first substrate first region, exposing the MEMS device to a first environment via the second substrate opening; and,
    a wall along the first region boundaries, between the first and second substrates, isolating the MEMS device from the electrical circuit.

2. The MEMS integrated package of claim 1 wherein the wall encloses the MEMS device between the first and second substrates along the first region boundaries.

3. The MEMS integrated package of claim 1 wherein the MEMS is a micro-fluidic MEMS; and,
    wherein the second substrate opening exposes the micro-fluidic MEMS to a fluid environment.

4. The MEMS integrated package of claim 1 wherein the electrical circuit on the second region of the first substrate is an active circuit including a TFT, electrically connected to the MEMS; and,
    wherein the wall separates the TFT, exposed to a first environment, from the MEMS, exposed to a second environment.

5. The MEMS integrated package of claim 1 wherein the wall is a cured sealant.

6. The MEMS integrated package of claim 1 further comprising:
    a plurality of uniform-shaped spacers applied to the first substrate; and,
    wherein the wall is a cured sealant, with a uniform height between the first and second substrates, response to the spacers.

7. The MEMS integrated package of claim 1 wherein the first substrate includes a plurality of regions with boundaries;
    the MEMS integrated package further comprising:
    a plurality of MEMS devices on the first substrate, each in a corresponding region; and,
    a plurality of walls, each wall formed around the boundaries of a corresponding region of the first substrate.

8. The MEMS integrated package of claim 1 further comprising:
    a boundary assembly shape matching the first region boundaries, and having a height; and,
    wherein the wall comprises the boundary assembly attached to the first substrate along the first region boundaries, separating the first substrate from the second substrate by the boundary assembly height.

9. An integrated microelectromechanical system (MEMS) device package, the MEMS integrated package comprising:
    a liquid crystal display (LCD) substrate having a perimeter and a first region with boundaries;
    an electrical circuit on a second region of the first substrate, electrically connected to the first substrate;
    a MEMS device on the first region, electrically connected to the first substrate;
    a color filter substrate overlying the LCD substrate; and,
    a seal formed along the perimeters of the display substrate and color filter substrate; and,
    a cavity between the display substrate and the color filter substrate, bounded by the seal.

10. The MEMS integrated package of claim 9 further comprising:
liquid crystal material in the cavity.

11. The MEMS integrated package of claim 9 wherein the color filter substrate has an opening through the substrate, overlying the first substrate first region;
wherein the MEMS device is a MEMS microphone.

12. The MEMS integrated package of claim 9 wherein the seal encloses the MEMS device between the LCD and color filter substrates along the first region boundaries.

13. The MEMS integrated package of claim 9 wherein the seal hermetically seals the MEMS device between the LCD and color filter substrates along the first region boundaries.

14. The MEMS integrated package of claim 9 wherein the MEMS device is selected from the group including an acoustic speaker, a microphone, a radio frequency (RF) filter, an RF antenna, an accelerometer, a gyroscope, a chemical sensor, a temperature sensor, a humidity sensor, a pressure sensor, a light sensor, an infrared sensor, and an actuator.

15. An integrated microelectromechanical system (MEMS) device package, the MEMS integrated package comprising:
a first substrate having a first region and a groove formed along first region boundaries;
an electrical circuit on a second region of the first substrate, electrically connected to the first substrate;
a MEMS device on the first region, electrically connected to the first substrate;
a second substrate overlying the first substrate, with a groove formed in a region opposite the groove in the first substrate; and,
a wall formed from an O-ring seated in the first and second substrate grooves.

16. The MEMS integrated package of claim 15 wherein the O-ring wall encloses the MEMS device between the first and second substrates along the first region boundaries.

17. The MEMS integrated package of claim 16 wherein the O-ring wall hermetically seals the MEMS device between the first and second substrates along the first region boundaries.

18. The MEMS integrated package of claim 15 wherein the MEMS device is selected from the group including an acoustic speaker, a microphone, a radio frequency (RF) filter, an RF antenna, an accelerometer, a gyroscope, a chemical sensor, a temperature sensor, a humidity sensor, a pressure sensor, a light sensor, an infrared sensor, and an actuator.

19. The MEMS integrated package of claim 15 wherein the second substrate has an opening overlying the first substrate first region, exposing the MEMS device to a first environment via the second substrate opening; and
wherein the O-ring wall isolates the MEMS device from the electrical circuit.

* * * * *